US009348000B1

(12) United States Patent
Pressesky et al.

(10) Patent No.: US 9,348,000 B1
(45) Date of Patent: May 24, 2016

(54) MAGNETO OPTIC KERR EFFECT MAGNETOMETER FOR ULTRA-HIGH ANISOTROPY MAGNETIC MEASUREMENTS (71) Applicant: Seagate Technology LLC, Cupertino, CA (US)

(72) Inventors: Jason L. Pressesky, Menlo Park, CA (US); Ganping Ju, Pleasanton, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 486 days.

(21) Appl. No.: 13/836,466

(22) Filed: Mar. 15, 2013

Related U.S. Application Data (60) Provisional application No. 61/740,324, filed on Dec. 20, 2012.

(51) Int. Cl.
G01R 33/032 (2006.01)

(52) U.S. Cl.
CPC .................. *G01R 33/0325* (2013.01)

(58) Field of Classification Search
CPC ................................... G01R 33/0325
USPC ......... 324/244.1, 212, 260; 369/13.01–13.55; 359/484.01–484.1
See application file for complete search history.

(56) References Cited

U.S. PATENT DOCUMENTS

| 3,625,617 A | 12/1971 | Chen |
| 3,631,415 A | 12/1971 | Aagard et al. |
| 3,734,625 A | 5/1973 | Aagard |
| 4,112,367 A * | 9/1978 | Hepner et al. ............. 324/244.1 |
| 4,731,581 A * | 3/1988 | Doriath et al. ............. 324/244.1 |
| 5,136,239 A | 8/1992 | Josephs |
| 5,493,220 A | 2/1996 | Oliver et al. |
| 5,652,054 A | 7/1997 | Kikitsu et al. |
| 5,710,746 A | 1/1998 | Uchiyama et al. |

(Continued)

FOREIGN PATENT DOCUMENTS

| DE | 602004013240 | 5/2009 |
| EP | 71007 | 10/1986 |

(Continued)

OTHER PUBLICATIONS

GMW, 5404 Dipole Electromagnet,http://www.gmw.com/electro-magnets/dipole/5404/documents/5404_Brochure_27OCT2011.pdf, 2011.*

(Continued)

*Primary Examiner* — Patrick Assouad
*Assistant Examiner* — Demetrius Pretlow
(74) *Attorney, Agent, or Firm* — Hollingsworth Davis, LLC (57) ABSTRACT A resistive electromagnet assembly comprises a pair of coils with a gap defined between the coils. The resistive electromagnet assembly is configured to generate a field having a magnetic flux density of at least about 4 Tesla and at a sweep rate to complete a hysteresis loop in less than about 1 minute. A support assembly is configured to support a sample of magnetic material within the gap. An optics module is configured to expose a test region of the magnetic material sample to an optical beam probe while the test region is subjected to the field and to receive a reflected beam from the test region. A processor is coupled to the optics module and configured to measure one or more properties of the magnetic material using the received reflected beam.

19 Claims, 6 Drawing Sheets (56) References Cited

U.S. PATENT DOCUMENTS

| | | |
|---|---|---|
| 5,736,856 A | 4/1998 | Oliver et al. |
| 5,838,444 A | 11/1998 | Jo |
| 5,852,591 A | 12/1998 | Fukumoto |
| 5,923,625 A | 7/1999 | Shimazaki et al. |
| 5,994,898 A | 11/1999 | DiMarzio et al. |
| 6,208,595 B1 | 3/2001 | Fukushima et al. |
| 6,261,707 B1 | 7/2001 | Murakami et al. |
| 6,429,984 B1 | 8/2002 | Alex |
| 6,433,543 B1 | 8/2002 | Shahinpoor et al. |
| 6,483,299 B1 * | 11/2002 | Pressesky et al. ............. 324/212 |
| 6,665,078 B1 | 12/2003 | Meeks et al. |
| 6,717,671 B1 | 4/2004 | Meeks et al. |
| 6,757,056 B1 | 6/2004 | Meeks et al. |
| 6,833,694 B2 | 12/2004 | Ikekame |
| 6,956,658 B2 | 10/2005 | Meeks et al. |
| 6,956,660 B2 | 10/2005 | Meeks et al. |
| 7,113,453 B1 | 9/2006 | Shimazaki et al. |
| 7,166,997 B2 | 1/2007 | Ju et al. |
| 7,268,979 B2 | 9/2007 | Gill |
| 7,397,621 B2 | 7/2008 | Hou et al. |
| 7,652,856 B2 | 1/2010 | Pinarbasi |
| 7,936,597 B2 | 5/2011 | Clinton et al. |
| 7,990,137 B2 | 8/2011 | Antoku |
| 8,068,317 B2 | 11/2011 | Gill |
| 8,228,636 B2 | 7/2012 | Lomakin et al. |
| 8,230,918 B2 | 7/2012 | Ameen |
| 8,254,066 B2 | 8/2012 | Hsu et al. |
| 8,259,409 B2 | 9/2012 | Braganca et al. |
| 8,283,622 B2 | 10/2012 | An et al. |
| 2002/0015146 A1 | 2/2002 | Meeks et al. |
| 2004/0066190 A1 * | 4/2004 | Ju et al. ....................... 324/244.1 |
| 2004/0219329 A1 | 11/2004 | Oikawa et al. |
| 2005/0012937 A1 * | 1/2005 | Tokura et al. ................. 356/614 |
| 2005/0283839 A1 | 12/2005 | Cowburn |
| 2007/0053106 A1 | 3/2007 | Sonobe et al. |
| 2009/0161269 A1 | 6/2009 | Freitag et al. |
| 2010/0079908 A1 | 4/2010 | Heidmann |
| 2010/0149676 A1 | 6/2010 | Khizorev et al. |
| 2010/0170017 A1 * | 7/2010 | Heidmann ....................... 850/48 |
| 2011/0242694 A1 | 10/2011 | Taguchi |
| 2012/0147379 A1 | 6/2012 | Choi et al. |

FOREIGN PATENT DOCUMENTS

| | | |
|---|---|---|
| EP | 2277175 | 1/2012 |
| WO | WO2009022993 | 2/2009 |
| WO | WO 2011155903 A1 * | 12/2011 |

OTHER PUBLICATIONS

NanoMOKE2—Specifications: Ultra-high sensitivity Kerr effect magnetometer, LOT-Oriel Group Europe, Apr. 2010, p. 1-8.

GMW Associates, "GMW 5404 Dipole Electromagnet", Oct. 29, 2010, 10 pages.

* cited by examiner

MAGNETO OPTIC KERR EFFECT MAGNETOMETER FOR ULTRA-HIGH ANISOTROPY MAGNETIC MEASUREMENTS

RELATED APPLICATIONS

This application claims the benefit of Provisional Patent Application Ser. No. 61/740,324 filed on Dec. 20, 2012, to which priority is claimed pursuant to 35 U.S.C. §119(e) and which is hereby incorporated herein by reference in its entirety.

SUMMARY

Embodiments are directed to a magneto optic Kerr effect (MOKE) magnetometer configured to generate a field having a magnetic flux density of at least about 3 Tesla and at a sweep rate to complete a hysteresis loop in less than about 1 minute for a sample of magnetic material having a coercivity of at least about 15 to 20 kOe. Some embodiments are directed to a MOKE magnetometer configured to generate a field having a magnetic flux density of at least about 4 Tesla and at a sweep rate to complete a hysteresis loop in less than about 1 minute for a sample of magnetic material having a coercivity of at least about 20 to 30 kOe.

Other embodiments are directed to a MOKE magnetometer configured to generate a field having a magnetic flux density of at least about 4 Tesla and at a sweep rate to complete a hysteresis loop in less than about 1 minute for a sample of magnetic material having a coercivity of at least about 20 to 40 kOe. Further embodiments are directed to a MOKE magnetometer configured to generate a field having a magnetic flux density of at least about 5 Tesla and at a sweep rate to complete a hysteresis loop in less than about 1 minute for a sample of magnetic material having a coercivity of up to about 45 kOe.

According to various embodiments, an apparatus includes a resistive electromagnet assembly comprising a pair of coils with a gap defined between the coils. The resistive electromagnet assembly is configured to generate a field having a magnetic flux density of at least about 3 Tesla, such as between about 4 and 5.5 Tesla, and at a sweep rate to complete a hysteresis loop in less than about 1 minute. A support assembly is configured to support a sample of magnetic material within the gap. An optics module is configured to expose a test region of the magnetic material sample to an optical beam probe while the test region is subjected to the field and to receive a reflected beam from the test region. A processor is coupled to the optics module and configured to measure one or more properties of the magnetic material using the received reflected beam.

In accordance with other embodiments, an apparatus includes a resistive electromagnet assembly comprising a pair of coils with a gap defined between the coils. A support assembly is configured to support a sample of magnetic material having a coercivity of at least 20 kOe within the gap. In some embodiments, the sample of magnetic material has a coercivity of between about 30 and 40 kOe. In other embodiments, the sample of magnetic material has a coercivity of at least 40 kOe, such as up to about 45 kOe. The resistive electromagnet assembly is configured to generate a field having a magnetic flux density sufficient to cause the magnetic material to reach saturation and at a sweep rate to complete a hysteresis loop in less than about 1 minute. An optics module configured to expose a test region of the magnetic material sample to an optical beam probe while the test region is subjected to the field and to receive a reflected beam from the test region. A processor is coupled to the optics module and configured to measure one or more properties of the magnetic material using the received reflected beam.

According to other embodiments, a method involves subjecting a sample of magnetic material to a field having a magnetic flux density of at least about 3 Tesla, such as between about 4 and 5.5 Tesla, and at a sweep rate to complete a hysteresis loop in less than about 30 seconds. The field is sufficient to cause a test region of the magnetic material to reach saturation. The method also involves exposing the test region to an optical beam probe while the test region is subjected to the field, receiving a reflected beam from the test region, and measuring one or more properties of the magnetic material using the received reflected beam.

In accordance with further embodiments, a method involves subjecting a sample of magnetic material to a field sufficient to cause the magnetic material at a test region to reach saturation and at a sweep rate to complete a hysteresis loop in less than about 1 minute. The magnetic material has a coercivity of at least about 20 kOe. In some embodiments, the sample of magnetic material has a coercivity of between about 30 and 40 kOe. In other embodiments, the sample of magnetic material has a coercivity of at least 40 kOe, such as up to about 45 kOe. The method also involves exposing the test region to an optical beam probe while the test region is subjected to the electromagnetic field, and receiving a reflected beam from the test region. The method further involves measuring one or more properties of the magnetic material using the received reflected beam.

These and other features and aspects which characterize various embodiments can be understood in view of the following detailed discussion and the accompanying drawings.

DETAILED DESCRIPTION

The next technology platform for magnetic recording media is likely to utilize magnetic material media characterized by extremely high (e.g., ultra-high) anisotropy. Magnetic recording media with extremely high anisotropy requires magnetic fields with very high magnetic flux density to characterize various magnetic properties of the media material. Typically, these high fields are provided by superconducting solenoids or hybrid superconducting magnets. A superconducting electromagnet, for example, is a type of electromagnetic with coils comprising superconducting wires made from Type II superconductors, such as niobium-titanium or niobium-tin. Unlike conventional or modified conventional resistive electromagnets, the superconducting wires of superconducting electromagnets conduct current without electrical resistance when properly cooled by a cryogen, such as liquid helium. A draw-back of superconducting solenoids or hybrid superconducting magnets is the relatively long sweep time (5-10 minutes) required to trace out a complete hysteresis loop. Such long sweep times makes use of these systems unsuitable as production support tools.

To ensure that magnetic recording disks meet certain standards of quality, these magnetic properties need to be tested from time to time, particularly during the manufacturing process. Two important magnetic properties of interest include coercivity and nucleation (reversal domain nucleation), among others. Coercivity, typically expressed in Oersteds, refers to the intensity of an applied magnetic field required to reduce the magnetization of a sample of ferromagnetic material to zero after the magnetization of the sample has been driven to saturation. The field at which the spins of a previously saturated ideal ferromagnetic particle cease to be aligned is defined as the nucleation field.

According to various representative embodiments, a magneto optic Kerr effect magnetometer is implemented using a modified conventional electromagnet that produces magnetic fields with a high magnetic flux density suitable for characterizing magnetic properties of magnetic recording media having an extremely high anisotropy. Extremely high anisotropy refers to anisotropy fields greater than about 20 kOe, such as greater than about 30 kOe in some embodiments or greater than about 40 kOe in other embodiments. Experimentation demonstrates that a modified conventional electromagnet utilized in various MOKE magnetometer embodiments disclosed herein can generate fields with a magnetic flux density in excess of about 3 Tesla (T), such as in excess of about 4 T, 5 T, and 6 T by way of representative examples, which is well within the range of fields generated by many typical superconducting solenoids and almost a factor of two times better than most laboratory electromagnets. Additionally, such modified conventional electromagnets according to various embodiments can be driven over their range of field very rapidly (on the order of seconds (i.e., <1 minute), such as 10 seconds) given a power supply that is well matched to the load.

Figure 1:
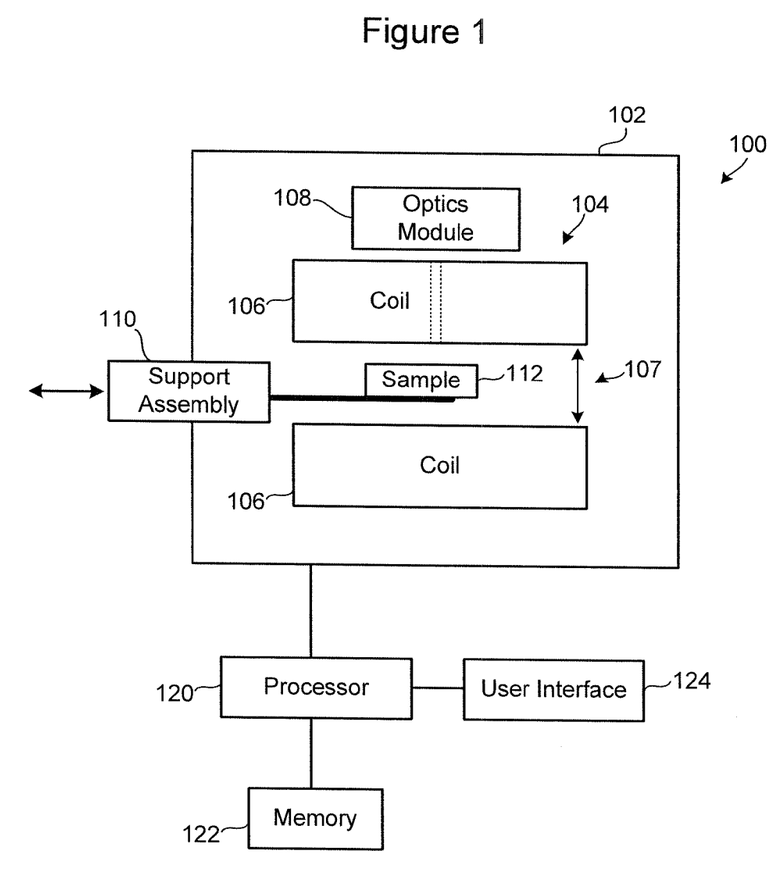
FIG. 1 illustrates a representative MOKE magnetometer in accordance with embodiments of the disclosure.

Referring now to FIG. 1, there is illustrated a representative MOKE magnetometer in accordance with an embodiment of the disclosure. The magnetometer 100 shown in FIG. 1 includes an electromagnet 104 comprising a pair of coils 106 coupled to a power supply (not shown). The electromagnet 104 is configured to generate fields with a magnetic flux density of at least 3 T, such as between about 4 and 5.5 T. In some embodiments, the electromagnet 104 is configured to generate fields with a magnetic flux density of at least 4 T. In other embodiments, the electromagnet 104 is configured to generate fields with a magnetic flux density of at least 5 T. In further embodiments, the electromagnet 104 is configured to generate fields with a magnetic flux density of at least 6 T.

When coupled to a bipolar power supply, the electromagnet 104 is implemented to complete a full field cycle at +/−3 T, 4 T, or 5 T in less than 30 seconds according to some embodiments, in less than 20 seconds in other embodiments, in less than 10 seconds in further embodiments, in less than 5 seconds in other embodiments, and in less than 3 seconds in still other embodiment. For example, the sweep rate to complete the hysteresis loop using the electromagnet 104 is between about 10 seconds and about 20 seconds according to some embodiments. In other embodiments, the sweep rate to complete the hysteresis loop using the electromagnet 104 is between about 2 seconds and about 10 seconds. In further embodiments, the sweep rate to complete the hysteresis loop by the electromagnet 104 is between about 2 seconds and about 5 seconds. In still other embodiments, the predetermined sweep rate to complete the hysteresis loop by the electromagnet 104 is between about 2 seconds and about 3 seconds. As was previously discussed, superconducting solenoids or hybrid superconducting magnets capable of generating fields between 1-5 T have relatively long sweep time (5-10 minutes) required to trace out a complete hysteresis loop.

Figure 6A:
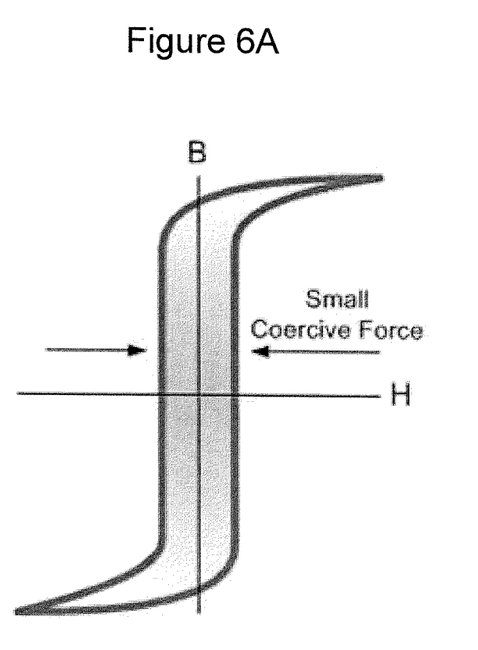
FIGS. 6A and 6B are representative hysteresis loops for magnetic materials having different coercivity, respectively.
Figure 6B:
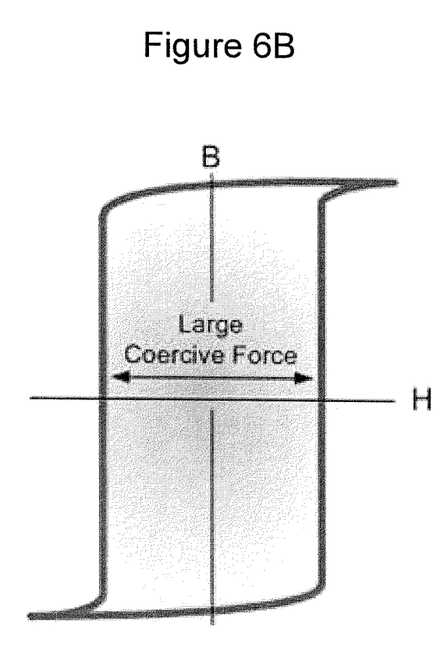

For purposes of explanation, reference is made to FIGS. 6A and 6B, which are B—H hysteresis loops for representative ferromagnetic materials that differ in terms of coercivity. FIG. 6A shows a hysteresis loop for a soft ferromagnetic material, which provides for a relatively small coercive force. FIG. 6B shows a hysteresis loop for a hard ferromagnetic material, which provides for a relatively large coercive force. The width of the middle section of the hysteresis loops is a measure of the coercivity of the material. The middle section width represents twice the coercivity of the material.

Although capable of generating high magnetic flux density fields, the electromagnet 104 does not include superconducting solenoids or hybrid superconducting magnets. Rather, the electromagnet 104 has a modified conventional design configured to generate fields with a high magnetic flux density yet has a relatively compact size. Copper coils with cooling water can be used to provide cooling for the electromagnet 104, eliminating the need for cryogenic cooling.

In accordance with various embodiments, the electromagnet 104 is a dipole electromagnet with a gap selectable between 1 mm and 5 mm, and produces a high magnetic flux density field in the range of about 4 T to 5 T. In some embodiments, the poles of the electromagnet 104 are interchangeable and can have a solid or axial hole design. In various embodiments, the electromagnet 104 can be mounted in any orientation. According to various embodiments, a suitable electromagnet having a modified conventional design is GMW 5404 Dipole Electromagnet available from GMW Associates, Inc., San Carlos, Calif.

The MOKE magnetometer 100 illustrated in FIG. 1 further includes an optics module 108 mounted in the housing 102 to the side of the electromagnet 104. The housing 102 is constructed of a magnetic field shielding material. The optics module 108 produces an optical probe beam which is directed via a set of steering optics down an axial hole in the electromagnet core. A support assembly 110, such as an X-Y positioner, controllably positions a sample 112 of magnetic material (e.g., a disk) to be tested, such that a desired test region of the sample 112 is exposed to the optical probe beam. A processor 120, coupled to a memory 122 and a user interface 124, controls the electromagnet 104 so that the magnetic field is swept in a matter of seconds, while the magnetization is recorded by the polarization sensing optics of the optics module 108 and a data acquisition system (e.g., processor 120 and memory 122). The processor 120 cooperates with the electromagnet 104 to control an orientation and a strength of the magnetic field applied at a given time to a portion (test region) of the sample 112. The support assembly 110 permits any location on the sample disk 112 to be measured, thus enabling surface maps of magnetic hysteretic properties to be generated in a reasonable time (e.g., <5 minutes for 100 locations sampled).

When an optical probe beam exhibiting polarization in a "plane of polarization" is incident on a test region of the sample disk 112 under the influence of an applied magnetic field, the incident optical beam is reflected by the sample disk 112, which results in a reflected optical beam with a polarization in a plane that is rotated an angle of rotation of polarization relative to a reference orientation that would be exhibited in the absence of the applied magnetic field. The angle of rotation of polarization is proportional by a factor, f, to the magnetization of the sample disk 112, where f is dependent on the magnetic material on the sample disk 112. When the magnetization of the magnetic material on the sample disk 112 is parallel to the surface of the sample disk 112 and in the plane of the incident optical beam, this produces a longitudinal Kerr effect. When the magnetization of the sample disk 112 is parallel to the surface of the sample disk 112 but orthogonal to the plane of the incident optical beam, this produces a transverse Kerr effect. When the magnetization of the sample disk 112 is orthogonal to the surface of the sample disk 112 and in the plane of the incident optical beam, this produces a polar Kerr effect. The Kerr signal and its components are collected by the processor 120 for each test region of the sample disk 112, from which various magnetic properties of the test region are computed.

According to various embodiments, the coercivity and nucleation field of a test region subjected to testing by the MOKE magnetometer 100 can be measured in the following way. A magnetic field having high magnetic flux density (e.g., 3 T, 4 T, 5 T, or 6 T) is generated by the electromagnet 104 and applied to the sample disk 112 with a certain sweep rate from a positive value (e.g., +5 T) to a negative value (e.g., −5 T) and then back to its original positive value. A polarized laser beam generated by the optics module 108 is shone towards the disk surface at a point of interest (e.g., test region) that is subjected to the magnetic field. The beam is reflected by the disk surface. Due to the Kerr effect, the reflected beam undergoes an amount of polarization rotation that depends on the magnetic properties of the disk surface, as previously discussed.

The Kerr signal is sampled many times during the sweeping of the magnetic field and a hysteresis loop is plotted from the acquired measurements. From this, the coercivity and nucleation field of the magnetic disk (at the point of interest) can be determined. To determine the coercivity and nucleation field of the magnetic disk at a second or subsequent test region on the surface of the sample disk 112, the position of the sample disk 112 is changed via the support assembly 110 and the process is repeated. In addition to coercivity and nucleation field, other magnetic properties of the sample disk 112 can be measured, such as the switching field distribution and uniformity. The sample disk 112 can have a diameter ranging between about 45 mm and about 100 mm. The sample disk 112 can have an industry-standard form factor, such as a 65 mm or 95 mm diameter.

Figure 2:
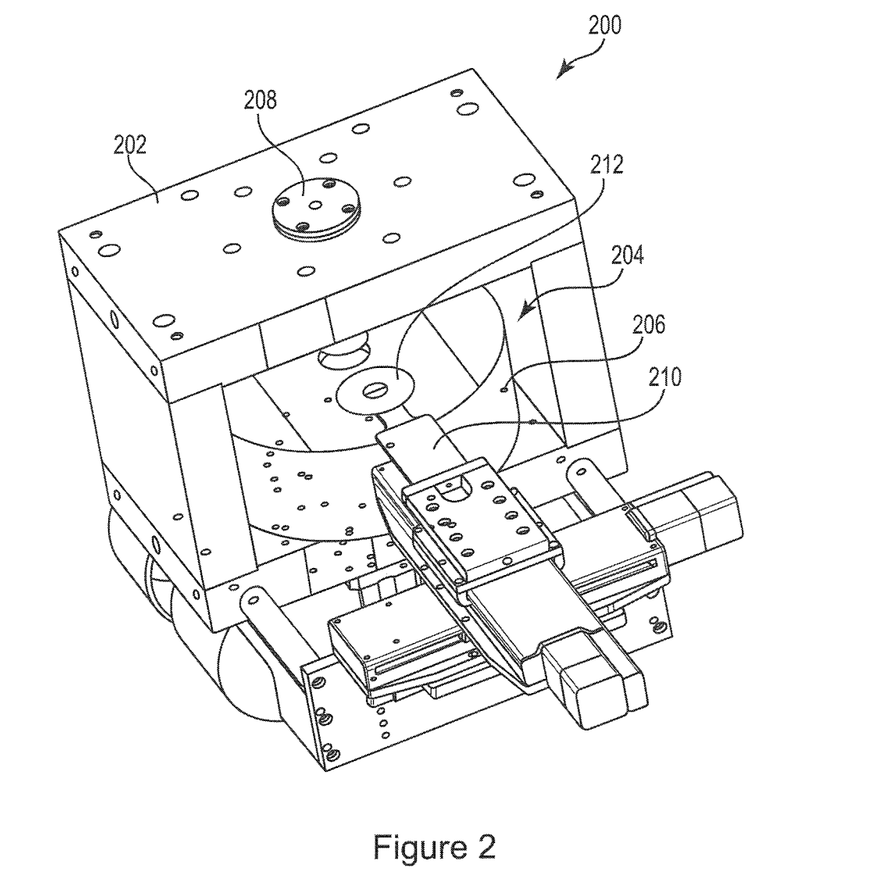
FIG. 2 illustrates a representative MOKE magnetometer in accordance with other embodiments of the disclosure.

FIG. 2 illustrates a representative MOKE magnetometer in accordance with another embodiment of the disclosure. The magnetometer 200 shown in FIG. 2 includes an electromagnet 204 comprising a pair of coils 206 coupled to a power supply (not shown). For clarity of illustration, one of the two coils 206 of the electromagnet 204 is not shown. The electromagnet 204 is configured to generate fields with a magnetic flux density of at least 3 T, such as 4 T, 5 T, and 6 T for example. When coupled to a bipolar power supply, the electromagnet 204 completes a full field cycle at +/−3 T, 4 T, 5 T or 6 T in less than 30 seconds according to some embodiments, in less than 20 seconds in other embodiments, and in less than 10 seconds in further embodiments.

The MOKE magnetometer 200 illustrated in FIG. 2 further includes an optics module 208 mounted to the housing 102 to the side of the electromagnet 204. The housing 202 is constructed of a magnetic field shielding material. The optics module 208 produces an optical probe beam which is directed via a set of steering optics down an axial hole in the electromagnet core. A support assembly 210, such as an X-Y positioner, controllably positions a sample 212 of magnetic material (e.g., a disk) to be tested, such that a desired test region of the sample 212 is exposed to the optical probe beam. The support assembly 210 permits any location on the sample disk 212 to be measured, thus enabling surface maps of magnetic hysteretic properties to be generated in a reasonable time (e.g., <5 minutes for 100 locations sampled).

Figure 3:
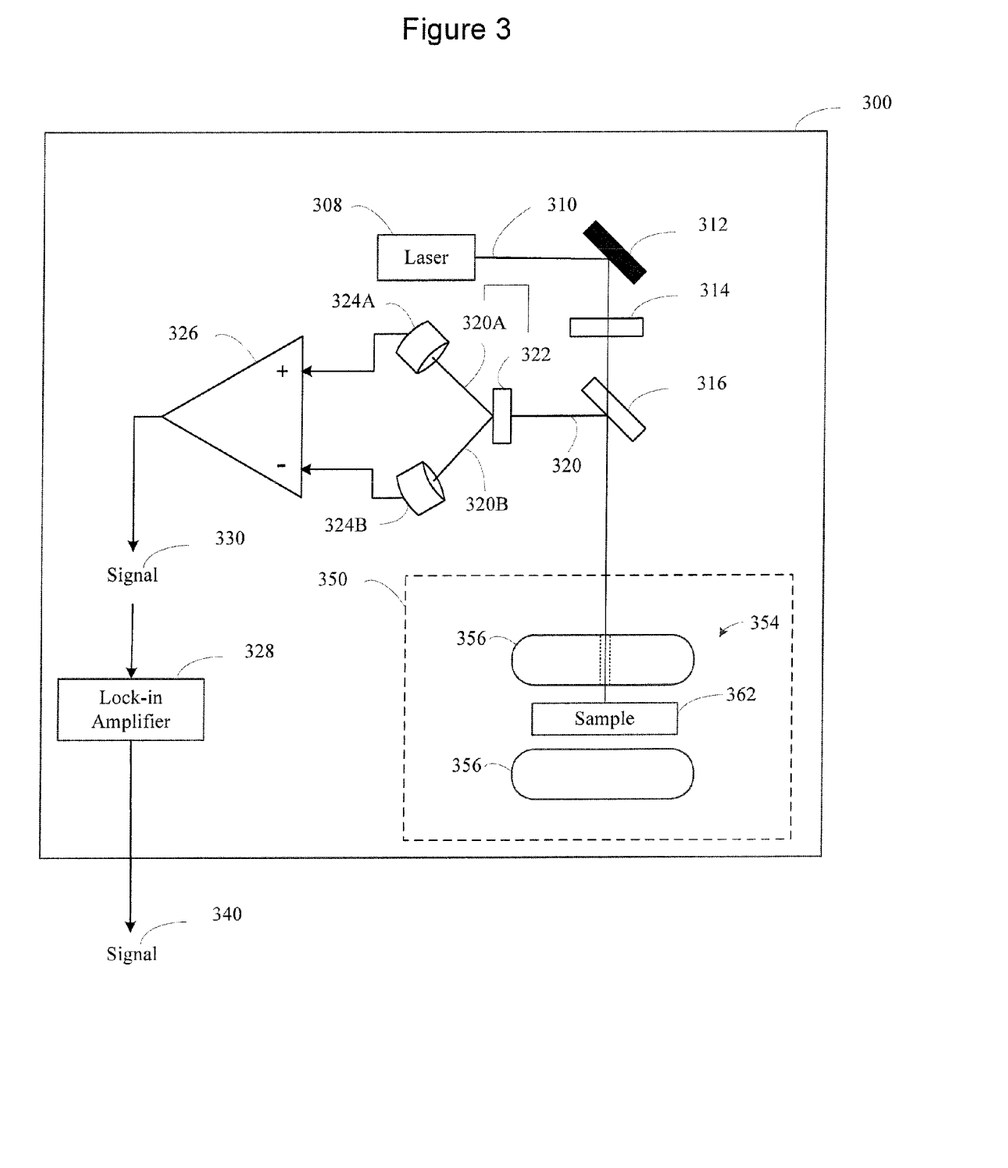
FIG. 3 shows a layout of a MOKE magnetometer in accordance with various embodiments.

FIG. 3 shows a layout of a MOKE magnetometer 300 in accordance with various embodiments. In the embodiment shown in FIG. 3, the magnetometer 300 includes a MOKE detector 350 which includes an electromagnet 354 configured to generate s high magnetic flux density field coupled to a power supply (not shown), a laser 308 (which produces incident beam 310), mirror 312, polarizer 314, beam splitter 316, Wollaston prism (or analyzer) 322, photodiodes 324A and 324B, differential amplifier 326, and lock-in amplifier 328. The laser 308 can be a diode laser or other laser, such as a He—Ne laser. In FIG. 3, a magnetic sample 362 is positioned between coils 356 of the electromagnet 354. Mechanical stability and an inert environment with a $N_2$ purging capability can be provided to enhance the performance of the apparatus shown in FIG. 3.

During MOKE testing, the magnetic sample 362 is subjected to a high magnetic flux density field which is oriented perpendicular to the plane of the sample 362. A magnetic field having a magnetic flux density between about 3-6 T is generated by the electromagnet 354. The laser 308 serves as a light source for the MOKE probe. Incident beam 310 produced by the laser 308 is reflected by mirror 312, and passes through polarizer 314 and beam splitter 316. Incident beam 310 is reflected at the surface of sample 362 and undergoes a polarization alteration due to the magnetization of sample 362. Reflected beam 320 is reflected by beam splitter 316 to a detection arm which includes Wollaston prism 322 and photodiodes 324A and 324B.

Wollaston prism 322, or other analyzer, is used to separate polarized beam components 320A and 320B of the reflected beam 320. Photodiodes 324A and 324B provide positive and negative input signals to differential amplifier 326. The output of differential amplifier 326 is a signal 330 representing a difference in intensity of components 320A and 320B of the reflected beam 320, which is proportional to the change of magnetization at the test region of the sample 362. Lock-in amplifier 328, using the output signal 330 from differential amplifier 326, is configured to determine the real and imaginary components of the signal 330 and generate an output signal 340.

Figure 4:
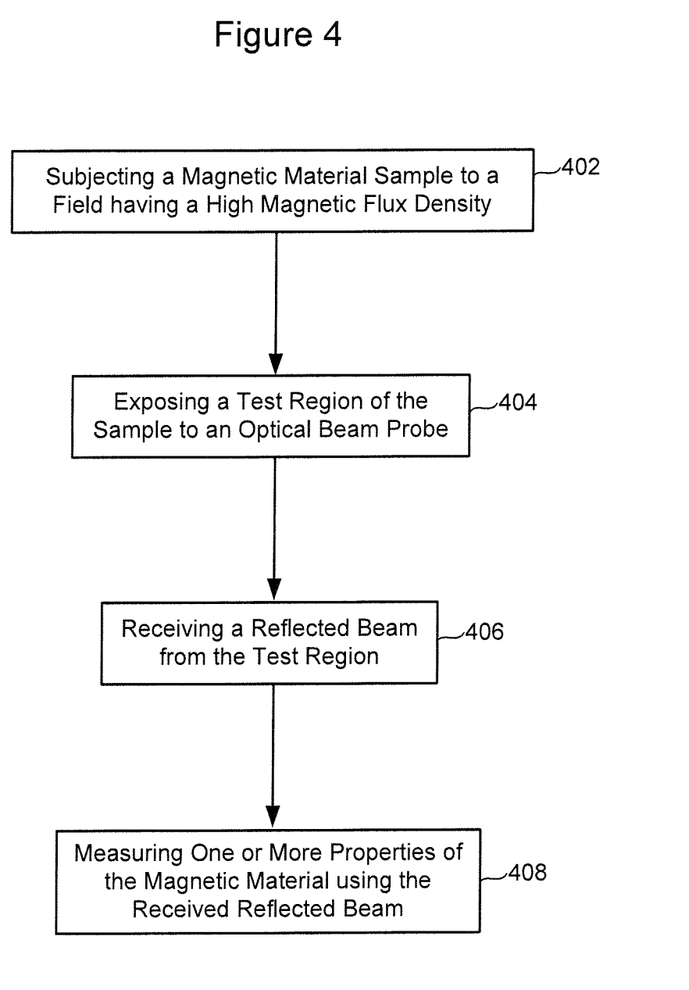
FIG. 4 is a flow chart illustrating various processes performed by a magneto optic Kerr effect magnetometer configured for ultra-high anisotropy magnetic measurements in accordance with embodiments of the disclosure.

FIG. 4 is a flow chart illustrating various processes performed by a magneto optic Kerr effect magnetometer configured for ultra-high anisotropy magnetic measurements in accordance with embodiments of the disclosure. According to the embodiment shown in FIG. 4, the ultra-high anisotropy magnetic measurement method involves subjecting 402 a magnetic material sample to a field having a high magnetic flux density. The method also involves exposing 404 a test region of the sample to an optical beam probe, and receiving 406 a reflected beam from the test region. The method further involves measuring 408 one or more properties of the magnetic material using the received reflected beam. At least some of the measured properties are only measurable because the field is sufficient to cause the magnetic material at the test region to reach saturation. In some embodiments, the coercivity of the magnetic material sample is greater than about 20 kOe (e.g., greater than about 30 kOe, such as between about 40 and 45 kOe), and the sweep rate to complete the hysteresis loop is between about 2 seconds and about 10 seconds.

Figure 5:
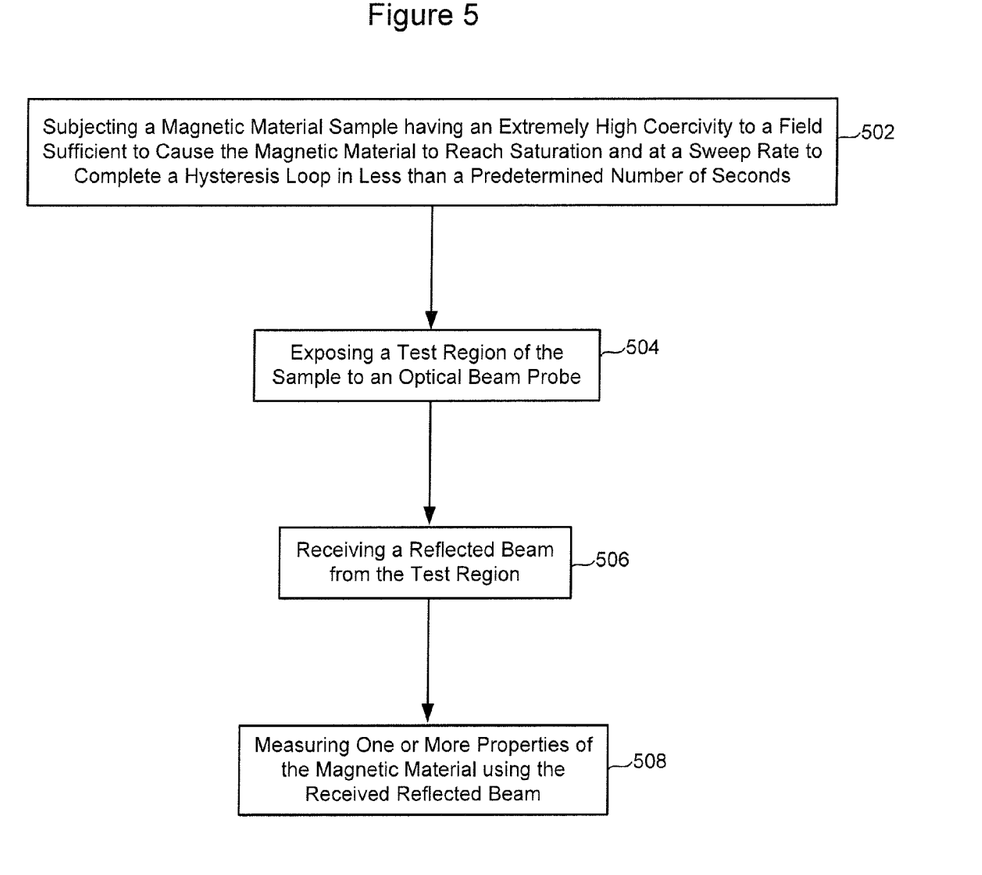
FIG. 5 is a flow chart illustrating various processes performed by a magneto optic Kerr effect magnetometer configured for ultra-high anisotropy magnetic measurements in accordance with other embodiments of the disclosure.

FIG. 5 is a flow chart illustrating various processes performed by a magneto optic Kerr effect magnetometer configured for ultra-high anisotropy magnetic measurements in accordance with other embodiments of the disclosure. According to the embodiment shown in FIG. 5, the ultra-high anisotropy magnetic measurement method involves subjecting 502 a magnetic material sample having an extremely high coercivity to a field sufficient to cause the magnetic material to reach saturation and at a sweep rate to complete a hysteresis loop in less than a predetermined number of seconds. The method also involves exposing 504 a test region of the sample to an optical beam probe, and receiving 506 a reflected beam from the test region. The method further involves measuring 508 one or more properties of the magnetic material using the received reflected beam. At least some of the measured properties are only measurable because the field is sufficient to cause the magnetic material at the test region to reach saturation. In some embodiments, the coercivity of the magnetic material sample is greater than about 20 kOe (e.g., greater than about 30 kOe, such as between about 40 and 45 kOe), and the sweep rate to complete the hysteresis loop is between about 2 seconds and about 10 seconds.

It is to be understood that even though numerous characteristics and advantages of various embodiments disclosed herein have been set forth in the foregoing description, together with details of the structure and function of various embodiments, this detailed description is illustrative only, and changes may be made in detail, especially in matters of structure and arrangements of parts within the principles of the presently disclosed subject matter to the full extent indicated by the broad general meaning of the terms in which the appended claims are expressed.

What is claimed is:

1. An apparatus, comprising:
a resistive electromagnet assembly comprising a pair of coils with a gap defined between the coils, the resistive electromagnet assembly configured to generate a field having a magnetic flux density of at least about 4 Tesla and at a sweep rate to complete a hysteresis loop in less than about 1 minute;
a support assembly configured to support a sample of magnetic material having a coercivity of at least 20 kOe within the gap;
an optics module configured to expose a test region of the magnetic material sample to an optical beam probe while the test region is subjected to the field and to receive a reflected beam from the test region; and
a processor coupled to the optics module and configured to measure one or more properties of the magnetic material using the received reflected beam, the processor further configured to measure the one or more properties at each of a plurality of locations on the sample at a rate of one hundred locations within five minutes.

2. The apparatus of claim 1, wherein the field has a magnetic flux density of between about 4 and 5.5 Tesla.

3. The apparatus of claim 1, wherein the sweep rate to complete the hysteresis loop is less than about 10 seconds.

4. The apparatus of claim 1, wherein the sweep rate to complete the hysteresis loop is between about 2 and 10 seconds.

5. The apparatus of claim 1, wherein the sample of magnetic material is disposed on a disk substrate having a diameter ranging from about 45 mm to about 100 mm.

6. The apparatus of claim 1, wherein the measured one or more magnetic properties comprises at least one of coercivity and nucleation field at the test region.

7. The apparatus of claim 1, wherein the measured one or more magnetic properties comprises at least one of switching field distribution and uniformity.

8. An apparatus, comprising:
a resistive electromagnet assembly comprising a pair of coils with a gap defined between the coils;
a support assembly configured to support a sample of magnetic material having a coercivity of at least 20 kOe within the gap, the resistive electromagnet assembly configured to generate a field having a magnetic flux density to cause the magnetic material to reach saturation and at a sweep rate to complete a hysteresis loop in less than about 1 minute;
an optics module configured to expose a test region of the magnetic material sample to an optical beam probe while the test region is subjected to the field and to receive a reflected beam from the test region; and
a processor coupled to the optics module and configured to measure one or more properties of the magnetic material using the received reflected beam, the processor further configured to measure the one or more properties at each of a plurality of locations on the sample at a rate of one hundred locations within five minutes.

9. The apparatus of claim 8, wherein the sample of magnetic material has a coercivity of between about 20 and 45 kOe.

10. The apparatus of claim 8, wherein the sample of magnetic material has a coercivity of at least 40 kOe.

11. The apparatus of claim 8, wherein the field has a magnetic flux density of between about 4 and 5.5 Tesla.

12. The apparatus of claim 8, wherein the sweep rate to complete the hysteresis loop is less than about 20 seconds.

13. The apparatus of claim 8, wherein the sweep rate to complete the hysteresis loop is between about 2 and 10 seconds.

14. The apparatus of claim 8, wherein the measured one or more magnetic properties comprises at least one of coercivity and nucleation field at the test region.

15. The apparatus of claim 8, wherein the measured one or more magnetic properties comprises at least one of switching field distribution and uniformity.

16. A method, comprising:
subjecting a sample of magnetic material having a coercivity of between about 20 and 45 kOe to a field having a magnetic flux density of at least about 4 Tesla and at a sweep rate to complete a hysteresis loop in less than about 30 seconds, the field to cause a test region of the magnetic material to reach saturation;
exposing the test region to an optical beam probe while the test region is subjected to the field;
receiving a reflected beam from the test region; and
measuring one or more properties of the magnetic material using the received reflected beam at each of a plurality of locations on the sample at a rate of one hundred locations within five minutes.

17. The method of claim 16, wherein the sweep rate to complete the hysteresis loop is between about 2 and 10 seconds.

18. The method of claim 16, wherein the sample of magnetic material is supported by a disk substrate, and the method further comprises performing the subjecting, exposing, receiving, and measuring at a plurality of test regions at varying radii of the disk substrate and at a rate of about 2 seconds to about 10 seconds for each test region.

19. The method of claim 16, wherein the measured one or more magnetic properties comprises at least one of coercivity, nucleation field, switching field distribution, and uniformity.

* * * * *